United States Patent [19]
Chapman

[11] Patent Number: 5,181,207
[45] Date of Patent: Jan. 19, 1993

[54] ERROR CORRECTION MECHANISM USING PATTERN PREDICTIVE ERROR CORRECTION CODES

[75] Inventor: Daniel H. Chapman, Palm Bay, Fla.
[73] Assignee: Harris Corp., Melbourne, Fla.
[21] Appl. No.: 646,862
[22] Filed: Jan. 28, 1991

Related U.S. Application Data

[63] Continuation of Ser. No. 181,701, Apr. 14, 1988, abandoned.

[51] Int. Cl.$^5$ .......................................... H03M 13/00
[52] U.S. Cl. .................................................. 371/37.4
[58] Field of Search ...................... 371/37.1, 37.4, 39.1

[56] References Cited

U.S. PATENT DOCUMENTS

| | | | |
|---|---|---|---|
| 4,633,470 | 12/1986 | Welch et al. | 371/37.1 |
| 4,821,268 | 4/1989 | Berlekamp | 371/37.1 |

OTHER PUBLICATIONS

Berlekamp, E., et al., "The Application of Error Control to Communications", *IEEE Communications Magazine*, Apr. 1987, vol. 25, No. 4, pp. 44–57.

*Primary Examiner*—Stephen M. Baker
*Attorney, Agent, or Firm*—Evenson, Wands, Edwards, Lenahan & McKeon

[57] ABSTRACT

A mechanism for correcting errors in a stream of digital data that are encoded at a transmitter site, transmitted over a communication channel to a receiver site and decoded at the receiver site to recover the digital data pre-encodes the data using a parity-encoder. The location of the errors is determined through a comparison operation on which the receiver is able to generate a 'template' of the pattern of errors in the received digital data stream. This error pattern template is then used in an iterative pattern predictive error correction process to identify the location of burst errors contained in the recovered data and to controllably modify the output of the receiver's host decoder so as to remove the located errors from the originally decoded data.

11 Claims, 4 Drawing Sheets

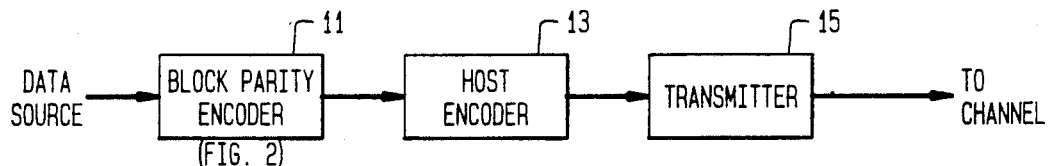
FIG. 1
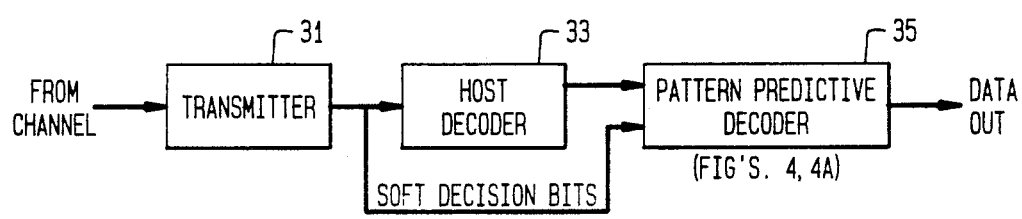
FIG. 3
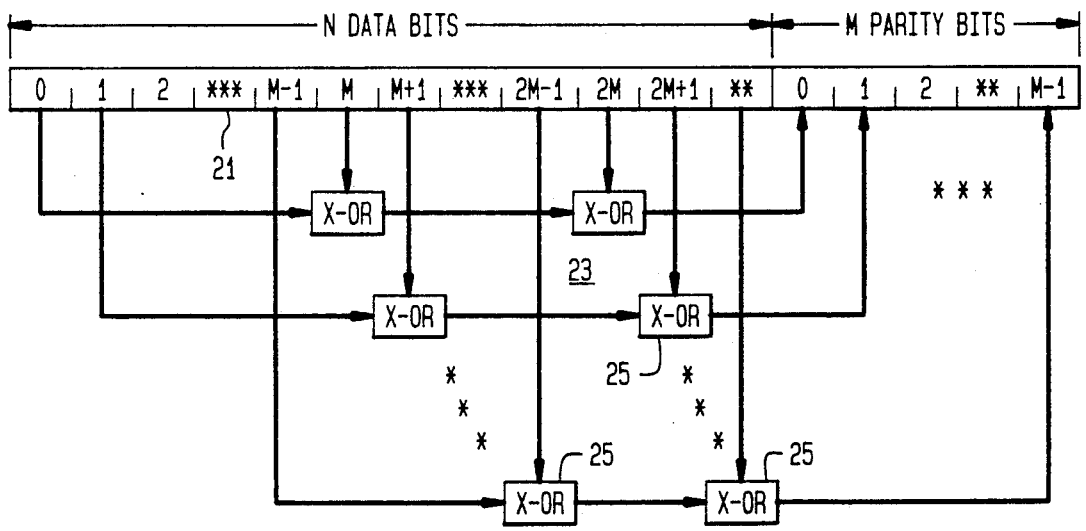
FIG. 2
| HOST DECODER OUTPUT BITS | 1 | 1 | 0 | 1 | 1 | 1 | 0 |
|---|---|---|---|---|---|---|---|
| METRIC 3 VALUES | -4 | -6 | +7 | +1 | -10 | -5 | -2 |
| TEMPLATE (ALIGNED WITH ERRORS) | | | [1 | 0 | 1 | 0] | |
| CORRECTED BITS | 1 | 1 | 1 | 1 | 0 | 1 | 0 |
TEMPLATE PLACED AT MOST
POSITIVE VALUE OF METRIC 3
FIG. 8

| DATA TO BE RE-ENCODED | 1 | 1 | 0 | 0 | 1 | 1 | 1 |
|---|---|---|---|---|---|---|---|
| RE-ENCODED DATA (R-1/20) | 77 | 07 | 77 | 00 | 70 | 07 | 07 |
| RECEIVE SOFT DECISION DATA | 65 | 03 | 57 | 02 | 61 | 37 | 26 |
| HAMMING DISTANCES | 12 | 04 | 20 | 02 | 21 | 30 | 21 |

WINDOW LENGTH M+R

HAMMING DISTANCES   12  04  20  02   21  30  21

SUMMATION OVER WINDOW  Σ  Σ  Σ  Σ

RESULTS   11   11   10   11

FIG. 5

WINDOW LENGTH M+R

| METRIC 1 VALUES | 12 | 14 | 10 | 9 | 7 | 20 | 13 |
|---|---|---|---|---|---|---|---|
| METRIC 2 VALUES | 10 | 20 | 11 | 9 | 10 | 19 | 18 |
| DIFFERENCES | 2 | -6 | -1 | 0 | -3 | 1 | -5 |

SUMMATION OVER WINDOW   Σ  Σ  Σ  Σ

METRIC 3 VALUES   -5   -10   -3   2-7

ERROR CORRECTION MECHANISM USING PATTERN PREDICTIVE ERROR CORRECTION CODES

This is a continuation of application Ser. No. 181,701, filed Apr. 14, 1988, now abandoned.

FIELD OF THE INVENTION

The present invention relates in general to digital signal processing systems and is particularly directed to a mechanism for locating and correcting errors in digital data that has been decoded in accordance with a decision-based data recovery process.

BACKGROUND OF THE INVENTION

Most digital data communication systems in use today employ some form of encoding mechanism (e.g. convolutional or block codes) to enable the receiver site to correct errors that have occurred in the course of data transmission over a noisy channel. In the course of the data recovery process linear block and convolutional codes operate to provide a 'best fit' between the data that was actually received and the data that was most probably transmitted. In the case of block codes, this best fit is obtained by forcing the received data into a known 'good' data pattern having a smallest Hamming distance difference. (Maximum likelihood) convolutional codes determine the best fit between received symbols and a corresponding data pattern using the smallest cumulative path metrics as the decision criterion. Once the data has been processed, however, the user is left with data that provides no indication of its correctness, except for a general probability of error that is constant for all data bits. Although soft decisions obtained from the channel receiver offer some degree of confidence of the encoded data, no information concerning the confidence level of a particular decoded data bit is provided. Simply put, there is no way to determine whether or not the decoded data contains errors, much less an indication of where such errors occur.

SUMMARY OF THE INVENTION

In accordance with the present invention, the above-mentioned shortcomings of conventional error correction code-based decoding schemes is obviated by a new and improved data recovery mechanism that is used in conjunction with a conventional host decoder and which takes advantage of information relating to error characteristics in the received data that otherwise goes unused during the data recovery process, in order to locate the occurrence of and correct errors in received digital data. More particularly, the present invention is directed to a mechanism for correcting errors in a stream of digital data that are encoded at a transmitter site, transmitted over a communication channel to a receiver site and decoded at said receiver site to recover the digital data. Pursuant to the present invention a small amount of additional overhead is imparted to the data at the transmitter site, in order to enable the receiver to generate a 'template' of the pattern of errors in the received digital data stream. This error pattern template is then used in a pattern predictive error correction process to identify the location of burst errors contained in the recovered data and to controllably modify the output of the receiver's host decoder so as to correct the located errors in the originally decoded data. More specifically, at the transmitter site, respective blocks of the original digital data are parity encoded to obtain respective sets of overhead bits that are appended to the blocks of the original data. The parity encoded data stream is then applied to the transmitter site's host encoder (e.g. a block or convolutional encoder) and the resulting encoded serial digital bit stream is transmitted over a communication channel to the receiver site. At the receiver site, the encoded digital bit stream that has been transmitted over said communication channel is subjected to a decision-based decoding mechanism to derive output data representative of the blocks of original digital data combined with the sets of overhead (parity) bits. This decoded output data stream is then processed in accordance with the parity encoding mechanism through which the original digital data were parity encoded to obtain respective blocks of output digital data and associated sets of overhead bits. For each block of data the newly generated parity code is compared with the received parity code associated with that block of data to derive a 'template' representative of the pattern of errors in the block of output digital data. Each block of output digital data is then processed, using a set of 'closeness predicting' metrics based upon with its error pattern code and the decision-based decoding mechanism, so as to identify where, within that block of output digital data, the error burst is located. The template is then aligned with the location of the error burst and selected bits of the block are modified in accordance with the contents of the error pattern template, thereby correcting the errors in the data block.

BRIEF DESCRIPTION OF THE DRAWINGS

FIG. 1 diagrammatically illustrates the components of a transmitter site of a digital data communications system in accordance with the present invention;

FIG. 2 diagrammatically illustrates the configuration of block parity encoder 11 of FIG. 1;

FIG. 3 diagrammatically illustrates the configuration of a receiver site of a digital data communications system in accordance with the present invention;

FIGS. 5-8 are encoding diagrams for illustrating the operation of the functional units of the pattern predictive decoder of FIG. 4.

DETAILED DESCRIPTION

Figure 4:
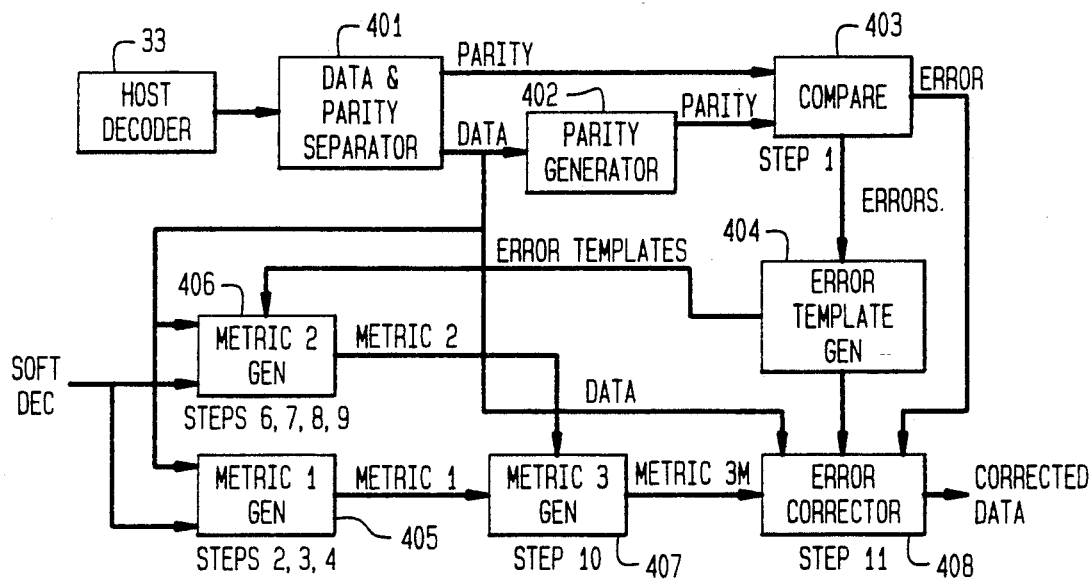
FIG. 4 is a functional block diagram of pattern predictive decoder 35 of the receiver site illustrated in FIG. 3.

Before describing in detail the particular improved error correction mechanism in accordance with the present invention, it should be observed that the invention resides primarily in a novel structural combination of conventional signal processing circuits and components and not in the particular detailed configurations thereof. Accordingly, the structure, control and arrangement of these conventional circuits and components have been illustrated in the drawings by readily understandable block diagrams which show only those specific details that are pertinent to the present invention, so as not to obscure the disclosure with structural details which will be readily apparent to those skilled in the art having the benefit of the description herein. Thus, the block diagram illustrations of the Figures do not necessarily represent the mechanical structural arrangement of the exemplary system, but are primarily intended to illustrate the major structural components of the system in a convenient functional grouping, whereby the present invention may be more readily understood.

As pointed out above, the pattern predictive coding mechanism in accordance with the present invention takes advantage of the ability of a host coding system to output data most likely to have been transmitted under the constraints of the encoding technique employed. In addition, the inventive mechanism supplies extra information relating to the performance of the host decoder and can determine whether or not the host decoder has made an error and the pattern of the error(s) made by the host decoder. On the basis of these determinations the error correction scheme performs a new 'best fit' of a derived error template on the decoder data. The cost of this additional error pattern information is only a fractional amount of overhead in the data bit stream, an increase in hardware and an increase in end-to-end delay imparted to the overall communication system.

Referring to FIG. 1, the transmitter site 10 of a digital data communications system in accordance with the present invention is diagrammatically illustrated as comprising a block parity encoder 11 (diagrammatically illustrated in FIG. 2, to be described below) to which a serial input digital data stream from a digital information source (not shown) is applied, a host (block, convolutional) encoder 13 coupled to the output of parity encoder 11, and a transmitter 15 to which the encoded digital bit stream produced by host encoder 13 is applied for transmission over a channel 20. As noted previously, by adding an additional, low overhead, encoding mechanism to the encoding equipment at the transmitter site it is possible to generate, downstream at the receiver site, a template which is representative of the pattern of errors that may be introduced onto the data in the course of transmission over channel 20 or in the course of data recovery at the receiver site.

A block parity encoder is well suited for this purpose because of the nature of the errors that can be expected to occur and the ability of this particular encoding mechanism to detect such error bursts. Assuming that the spread of bits in error within the total length of an error burst is not expected to exceed J bits, then the number M of parity bits in a block of data should be selected to be at least as large as J bits in order to correct the errors. In the block diagram of a FIG. 2, parity encoder 11 is shown as having a conventional configuration comprising a shift register 21 to the first N stages of which a block of data, N bits in length, to be encoded and transmitted, is applied, together with an array 23 of cascaded modulo-two adders 25 that are coupled to successively spaced-apart stages of register 21 and the outputs of which are coupled to the N+1 through (N+M)th stages of register 21, thereby appending a block of M parity bits to a block of N data bits, where N is an integral multiple of M. With the staggered cascading of the modulo-two adders to successive stages of register 21, then with the data bits being identified as bits {m0, m1, m2, ..., m(M−1)}, a parity bit m(i) is the modulo-two sum of the data bit set (n(i), n(M+i), n(2M+i), ..., (((N/M)−1)M+i)).

The resulting combined data and parity bit stream is clocked out of register 21 and sent to host encoder 13 (FIG. 1) for block or convolutional encoding and then transmitted. During this encoding process the host encoder sees only a serial bit stream so that it treats the combination of data and parity bits as simply data bits Namely, it is unnecessary to alter host encoder 13 in order to accommodate the extra level of (parity) encoding, so that existing host encoding (and decoding) schemes can remain 'as is', (except for the fact that the input of host encoder 13 is coupled to receive the output of parity encoder 11 rather than the original data stream).

The configuration of a receiver site is diagrammatically shown in FIG. 3 as comprising a receiver 31 which demodulates the transmitted encoded combined data and parity bit stream (using some form of 'soft decision' criterion) and produces an output bit stream corresponding to the encoded output of encoder 13 at the transmitter site together with an indication of the confidence level of the decision made on each demodulated data bit. For this purpose, receiver 31 may comprise a modem commonly employed in commercial PCM communication equipment, such as digital microwave radios and satellite-to-earth communication links, that outputs not only hard decision data, but also confidence bits The demodulated data is then coupled to a host decoder 33, such as a conventional block or convolutional decoder that complements the encoding operation of host encoder 13 at transmitter site 10, with the soft decision bits produced in the demodulation process also being coupled to a pattern predictive decoder 35 (a functional block diagram of which is illustrated in FIG. 4, to be described below) through which the error location and correction mechanism of the present invention is implemented. Pattern predictive decoder 35 is also coupled to receive the decoded output data and parity bit stream produced by host decoder 33, which, in effect, constitutes a 'first cut' at a best estimate of the data that was actually transmitted. This first cut is then further processed by the pattern predictive decoder using the soft decision information from the receiver and the added overhead (parity) bits that have were appended to the original data upstream of the host encoder at the transmitter site.

Figure 4A:
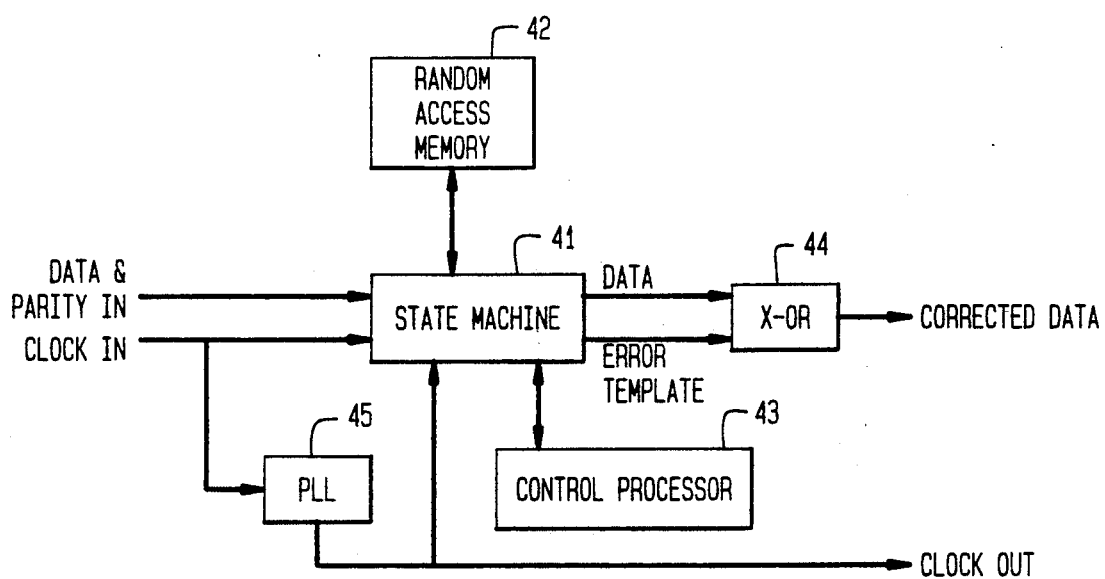
FIG. 4A is a hardware block diagram of pattern predictive decoder 35.

More particularly, the pattern predictive decoding mechanism in accordance with the present invention is shown in FIG. 4 as a set of functional blocks that operate on the output of the host decoder (using the soft decision information from the receiver) and execute an error pattern refinement sequence in order to detect the presence and pattern of errors in the 'first cut' decoded data, identify the location of such errors, and then modify those bits at the identified location within a block of data which the derived error pattern indicates should be corrected. The hardware of the pattern predictive decoder is preferably comprised of combinational logic, memory and flip-flops and, as such, does not reside in a particular logic set. One example of such hardware is illustrated in FIG. 4A as comprising a set of combinational logic and flip-flop unit 41, an associated random access memory 42 and a control processor or state machine 43 (which provides overall control and sequences the hardware through the decoding mechanism to be described in detail below). Processing of the data, such as the generation of metrics and parity is accomplished principally with combinational logic and flip-flop unit 41. Data, parity and the metrics are stored in random access memory 42 until needed by unit 41. Data is corrected by an error template through a modulo-two adder 44. Because parity bits are stripped off the data stream, the output clock rate is slower than the input clock rate. Where a continuous output clock is required by the host system, as in the case of a host block decoder, a phase-locked loop 45 is coupled to generate the output clock and provide the requisite timing signals.

FIG. 4 shows the signal processing operations (to be detailed below) that the pattern predictive decoder hardware performs in the course of its iterative analysis of the output of the host decoder and its correction of such output data. Since the basic operation of the present invention is predicated upon its ability to detect and locate errors in the host-decoded output data stream, the initial operation carried out by the pattern predictive decoder is the detection of the presence of errors. If it can be immediately determined that the incoming data is 'clean', then further processing is unnecessary and the data (without the appended parity bits) can be passed 'as is' directly from the output of the host decoder to a downstream user output. Pursuant to the present invention, the presence of errors and the pattern of those errors can be easily determined by comparing the parity bit stream that is appended to each block of data from the host decoder with a newly generated parity bit stream that is derived from the decoded data block.

For this purpose, as each block of N data bits and M appended parity bits are output from the host decoder 33 the parity bits are stripped off (data/parity separator 401) and the data bits are applied to a parity generator 402 which is identical to the parity encoder employed at the transmitter site (described with reference to FIG. 2, above). If the output of the host decoder 33 is error free, then the stripped off parity bits derived form data/parity separator 401 and the re-encoded parity bits derived from generator 402 should match one another, so that the data can be delivered to a downstream user, unmodified If the two parity codes do not match each other, however, then it is determined that the decoded data contains errors which are to be corrected. Whether or not the decoded parity bit portion of the output data stream from the host decoder indicates the presence of errors is determined by parity code comparator 403 which compares the newly generated (M-bit) parity code from parity generator 402 with the (M-bit) parity code output from data/parity separator 401 and couples an error indication output signal to a downstream error correction unit 408 in which errors are corrected in accordance with a template indicative of the pattern of the errors detected by comparator 403.

For this purpose any errors detected by comparator 403 are coupled to an error template generator 404 which generates an M-bit code the contents of which are zeros at all locations where the parity bits compared by comparator 404 match one another and are ones at those bit positions where a parity bit error was detected For each block of decoded data its associated error template is coupled to a metric 2 generator 406 (to be described below) and error correction unit 408. Metric 2 generator 406 also receives the soft decision bits from the demodulator and the block of N decoded data bits from data/parity separator unit 401. Error correction unit 408 also receives the block of N decoded data bits from separator unit 401 as well as error correction . refinement information supplied from a metric 3 generator 407, respective inputs of which are derived from a metric 1 generator 405 and metric 2 generator 406. The decoded data from separator 401 and the soft decision bits from the demodulator are further coupled to a metric 1 generator 405 the output of which is coupled as a second input to metric 3 generator 407. Assuming that comparator 403 has detected at least one mismatch between the parity bit patterns supplied by parity/data separator 401 and parity generator 402, the pattern predictive decoder proceeds to iteratively execute a set of metrics through which the errors are located and corrected as follows.

Within metric 1 generator 405, as a block of N decoded data bits is separated from its appended M parity bit codes, that block of data is re-encoded by an encoder identical to that contained within the host encoder at the transmitter site. For purposes of providing an illustrative example of the application of the present invention to a typical encoding process, an encoding scheme which employs a rate $R = \frac{1}{2}$, $k = 7$ maximum likelihood encoder will be considered. For an exemplary sequence of data bits 1 1 0 0 1 1 1 within a block of data output from the host decoder, let it be assumed that (metric 1) encoder 405 produces the sequence 11 01 11 00 10 01 01 and a corresponding set of soft decision bits, the octal values of which are 77 07 77 00 70 07 07 (where "7" corresponds to a most-confident "1" and "0" corresponds to a most-confident "0"), as shown in FIG. 5 Also shown is a set of soft decision bits 65 03 57 02 51 37 26 which accompany the data sequence supplied from the demodulator. In accordance with the first part of the data refinement process carried out by the pattern predictive decoder, Hamming distances between the re-encoded data and the received soft decision data for each received symbol are summed to produce a set of metric 1 values. For the set of data in the example tabulated in FIG. 5 the Hamming distances (corresponding to the differences between the soft decision values) are 12 04 20 02 21 30 21. These Hamming distances are totalled or summed over an interval or window extending from each respective symbol to the symbol which occurs M/R symbols later, where R is the code rate of the code used in the host encoder. The window is then shifted by 1/R symbols to obtain the next value of the metric. Assuming that there are $M = 4$ parity bits generated per block of data, then, as shown in FIG. 5, each metric 1 value will be a sum of $M/R = 4/(\frac{1}{2}) = 8$ Hamming distance values, as shown. These metric 1 sums, which are a measure of the closeness, in Hamming distances, of the data output from the decoder, after it has been re-encoded, to the soft decision data from the demodulator, are iteratively generated over a series of $N + 1$ groups of 1/R symbols The smaller the metric 1 value, the closer the match, providing a preliminary indication of which data bits are likely to be in error.

Figure 6:
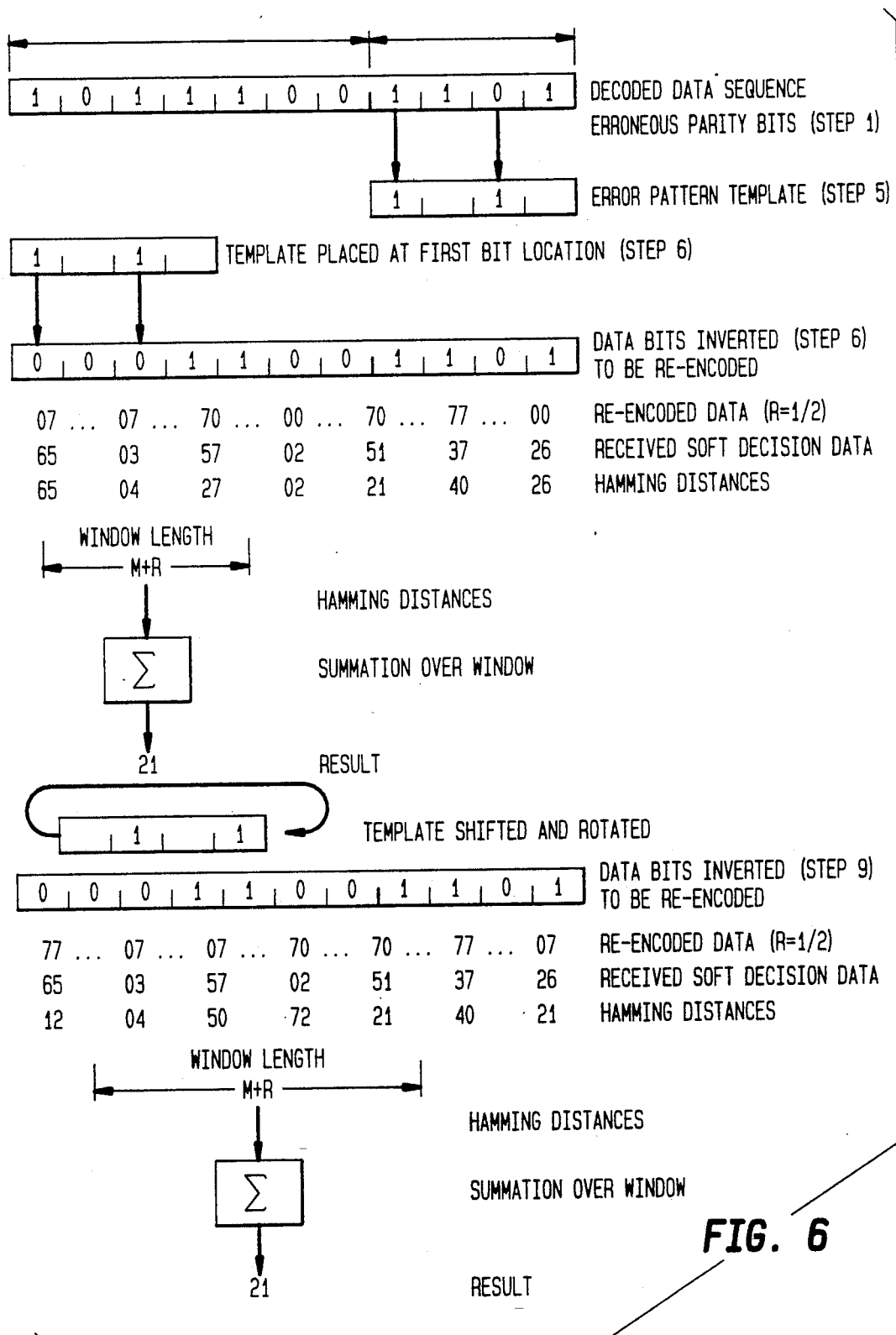

The operation of metric 2 generator 406, which is performed in parallel with the operation of metric 1 generator, is substantially the same as that of metric 1 generator 405, except that, prior to re-encoding the data output from the host decoder, selected ones of the data bits are modified (inverted) in accordance with the contents of the error pattern template supplied by error template generator 404. More particularly, as shown in FIG. 6, as described above, error template generator 404 produces an M bit output code the contents of which are zeros except for those parity bit locations where comparator 403 has detected a mismatch between the received parity bits and the re-encoded parity bits. This mismatch and corresponding template (1 0 1 0) are illustrated in FIG. 6 for an arbitrary set of $M = 4$ parity bits In accordance with the operation of metric 2 generator 406 the template is initially aligned with the decoded block of N data bits such that the first bit location of the template code coincides with the first bit location of the data block, as shown. Any bit in the data block that is aligned with a "1" in the template is inverted; other bits remain unchanged. The resulting 'template-modified' data block is then re-encoded and processed in accordance with the same procedure as carried out in metric 1 generator 405 for the first M/R bits (corresponding to the first window of metric 1), thereby obtaining the first summation value for metric 2, as shown in FIG. 6.

After obtaining this first summation value, based upon template-modified data, the error pattern template is 'rolled over' (in a manner similar to a tank tread) by one bit position, so that its first bit is aligned with the M+1 bit of the data, the alignment of the remaining bits 2−(M−1) being unchanged. This tread-like rolling over of the template ensures proper alignment of each bit of the template with those bits of the block of data from which their associated parity bit was generated. (See FIG. 2.) With the error pattern template aligned with the second through M+1 bits of the data the data is again modified by inverting any bit that is aligned with a "1" bit of the template and the resulting 'template-modified' data block is then re-encoded and processed in accordance with the same procedure as carried out for the first template position of metric 2, thereby obtaining the second summation value for metric 2. This sequence of steps roll the template down one bit, invert the data bits, re-encode the data, compare to soft decision data, sum over a window) is repeatedly carried out for the remaining bits and the first parity bit, so as to obtain a total of N+1 metric 2 values. These metric 2 values provide a measure of the closeness, in Hamming distances, of the data out of the host detector after it has been template-modified and re-encoded, to the soft decision data from the demodulator. As in the case of metric 1 values, the smaller the metric value, the closer the decoded data is to the soft decision data By rolling the template over successive bit positions of the data and iteratively modifying the data, metric 2 generator 406 provides an indication of which 'modifications' yield re-encoded data which closely match the soft decision data.

As each of metric 1 generator 405 and metric 2 generator 406 processes a block of data the generated (N+1) metric 2 values are subtracted from their corresponding (N+1) metric 1 values and the resulting difference values are summed over a M/R window, to produce a set of metric 3 values, as shown in FIG. 7. These metric 3 values provide a measure of the improvement the operation of metric 2 generator over metric 1 generator and how closely the error pattern and the repositioning of the error pattern template match errors in the data The more positive the metric 3 value the greater the improvement.

The final operation carried out by the pattern predictive decoder, illustrated in FIG. 8, involves aligning the first bit position of the error pattern template with the first bit position of the block of data and successively rolling over the template until its left-most bit is aligned with that bit position of the data whose corresponding metric three value is the most positive of all the metric 3 values With the template so aligned, those bits of the decoded data that are aligned with "1" bits of the template are then inverted to effect a correction of the detected error burst.

As will be appreciated from the foregoing description, the pattern predictive error correction coding/decoding scheme according to the preset invention overcomes the inability of conventional digital data error correction mechanisms to locate and correct burst errors in decoded data by taking advantage of information relating to error characteristics in the received data that otherwise goes unused during the data recovery process, with only a small increases in signal processing overhead By the simple addition of a parity encoder at the front end of the host encoding unit and the iterative analysis of the decoded data using a parity-based error pattern template burst errors in the decoded data can be located and then corrected according to the parity template.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed is:

1. A method of correcting errors in information signals that are encoded at a transmitter site, transmitted over a communication channel to a receiver site and decoded at said receiver site to recover the original information signals comprising the steps of:

at said transmitter site, (a) processing said original information signals to obtain first signals representative of characteristics of said information signals;

(b) combining said original information signals and said first signals and encoding the combined signals; and (c) transmitting the encoded combined signals over said communication channel to said receiver site; and at said receiver site, (d) receiving and demodulating the encoded combined signals that have been transmitted over said communication channel and producing demodulated signals representative of the encoded combined signals and soft decision signals representative of the level of confidence as to how accurately said demodulated signals represent the encoded combined signals;

(e) subjecting the demodulated and soft decision signals produced in step (d) to a decoding mechanism to derive output signals representative of the original information signals combined with said first signals;

(f) processing said derived output signals, in accordance with the signal processing mechanism through which the original information signals were processed in step (a) and in accordance with the soft decision signals processed in step (d) to obtain said first signals, and generating therefrom an error pattern template corresponding to the pattern of errors in said output signals;

(g) processing said derived output signals in accordance with said error pattern template and said decoding mechanism, so as to identify where, within said derived output signals, errors are located;

(h) modifying selected ones of said derived output signals in that portion thereof identified in step (g) in accordance with said error pattern template derived in step (f); and wherein step (f) comprises the steps of (f1) processing said derived output signals in accordance with the signal processing mechanism used in step (a) to obtain said first signals; and
(f2) comparing contents of the signals processed by step (f1) with contents of said received signals and generating therefrom said error pattern template; and wherein step (g) comprises the steps of (g1) encoding said derived output signals in accordance with the encoding mechanism employed in step (b) to obtain re-encoded output signals;
(g2) comparing the value of the re-encoded output signals obtained in step (g1) with the value of the encoded combined signals received and demodulated in step (d), and producing therefrom second signals representative of differences therebetween;
(g3) combining respective pluralities of said second signals to obtain respective pluralities of third signals;
(g4) selectively modifying the contents of a respective plurality of said derived output signals in accordance with said error pattern template, so as to obtain fourth signals representative of a modified version of said derived output signals;
(g5) encoding said fourth signals in accordance with the encoding mechanism employed in step (b) so as to obtain an encoded modified version of said derived output signals;
(g6) comparing the value of the encoded fourth signals obtained in step (g5) with the value of the encoded combined signals obtained in step (d), and producing therefrom fifth signals representative of differences therebetween;
(g7) combining a respective plurality of said fifth signals to obtain a respective sixth signal;
(g8) repeating steps (g4)–(g7) for successive pluralities of said derived output signals, thereby obtaining a plurality of said sixth signals;
(g9) generating eighth signals representative of differences between respective ones of said third and sixth signals; and
(g10) locating the beginning of the occurrence of errors in said derived output signals in accordance with prescribed characteristics of said seventh signals.

2. A method according to claim 1, wherein step (h) comprises modifying selected ones of said derived output signals in accordance with said error pattern template beginning with the occurrence of errors located in step (g11) and extending over the pattern of said error pattern template.

3. A method of correcting errors in a stream of digital data that are encoded at a transmitter site, transmitted over a communication channel to a receiver site and decoded at said receiver site to recover the digital data comprising the steps of:

at said transmitter site,
(a) processing respective blocks of the original digital data to obtain respective sets of overhead bits associated with said respective blocks and being representative of prescribed characteristics of said digital data;
(b) combining respective ones of said blocks of digital data with respective ones of said sets of overhead bits to produce a digital bit stream and encoding the digital bit stream; and
(c) transmitting the encoded digital bit stream over said communication channel to said receiver site; and at said receiver site,
(d) receiving and demodulating the encoded digital bit stream that has been transmitted over said communication channel and producing a demodulated digital bit stream representative of the encoded digital bit stream and soft decision bits representative of the level of confidence as to how accurately said demodulated digital bit stream represents the encoded digital bit stream;
(e) subjecting the demodulated digital bit stream and soft decision bits to a decoding mechanism to derive output data representative of the blocks of original digital data combined with said sets of overhead bits;
(f) processing said combined output digital data, in accordance with the signal processing mechanism through which the original digital data were processed in step (a) and in accordance with the soft decision bits produced in step (d) to obtain respective blocks of output digital data and associated sets of overhead bits, and generating therefrom respective error pattern template codes corresponding to the patterns of errors in said respective blocks of output digital data;
(g) processing said respective blocks of output digital data in accordance with said error pattern template codes and said decoding mechanism, so as to identify where, within said blocks of output digital data, errors are located; and
(h) modifying selected bits of a respective block of output digital data in that portion thereof identified in step (g) in accordance with its associated error pattern template code derived in step (f); and wherein step (f) comprises the steps of
(f1) processing said blocks of output digital data in accordance with the signal processing mechanism used in step (a) so as to obtain respective sets of output overhead bits associated therewith; and
(f2) comparing the respective sets of overhead bits contained in the combined output digital data with the respective sets of output overhead bits obtained in step (f1) and generating therefrom said error pattern template codes; and wherein step (g) includes
(g1) encoding said blocks of output digital data in accordance with the encoding mechanism employed in step (b) so as to obtain reencoded blocks of digital data and second codes representative of the confidence in the reencoded bit values thereof;
(g2) generating third codes representative of the Hamming distances between the reencoded blocks of digital data and the blocks of output digital data;
(g3) generating a first metric representative of a measure of proximation of the reencoded output data to the received data by summing respective pluralities of said third codes to obtain respective pluralities of fourth codes;
(g4) for each respective block of digital output data, selectively modifying the bit values of a respective portion thereof in accordance with its associated error pattern template code, so as to obtain a modified version of that respective block of output digital data;

(g5) encoding said modified version of a respective block of output digital data in accordance with the encoding mechanism employed in step (b), so as to obtain an encoded modified version of said respective block of output digital data;

(g6) generating fifth codes representative of the Hamming distances between the encoded modified version of said respective block of output digital data and its associated original output block of digital data;

(g7) generating a second metric representative of a measure of proximation of the encoded modified version of the respective block of output digital data to its associated original output block of digital data by summing respective pluralities of said fifth codes to obtain respective pluralities of sixth codes;

(g8) repeating steps (g4)-(g7) for successive portions of a respective block of output digital data, thereby obtaining a plurality of said sixth codes;

(g9) generating seventh codes representative of the differences between respective ones of said fourth and sixth codes;

(g10) generating a third metric by processing said seventh codes to obtain eighth codes; and (g11) locating the beginning of the occurrence of errors, in a respective block of said output digital data, at the bit position thereof, the corresponding eighth code for which has a prescribed value relative to the remaining ones of said eighth codes.

4. A method according to claim 3, wherein step (h) comprises modifying selected blocks of said output digital data in accordance with said error pattern template codes beginning with the occurrences of errors located in step (g11) and extending over the spans of the respective error pattern codes.

5. A method according to claim 3, wherein said overhead bits comprise parity bits.

6. A system for correcting errors in information signals that are encoded at a transmitter site, transmitted over a communication channel to a receiver site and decoded at said receiver site to recover the original information signals comprising:

at said transmitter site, first means for processing said original information signals to obtain first signals representative of characteristics of said information signals;

second means for combining said original information signals and said first signals and encoding the combined signals; and third means for transmitting the encoded combined signals over said communication channel to said receiver site; and at said receiver site, fourth means for receiving and demodulating the encoded combined signals that have been transmitted over said communication channel and producing demodulated signals representative of the encoded combined signals and soft decision signals representative of the level of confidence as to how accurately said demodulated signals represent the encoded combined signals; and fifth means for subjecting the demodulated and soft decision signals produced by said fourth means to a decoding mechanism to derive output signals representative of the original information signals combined with said first signals; and sixth means for processing said derived output signals, in accordance with the signal processing mechanism through which the original information signals were processed by said first means to obtain said first signals, and in accordance with the soft decision signals produced by said fourth means and generating therefrom an error pattern template corresponding to the pattern of errors in said output signals, processing said derived output signals in accordance with said error pattern template and said decoding mechanism, so as to identify where, within said derived output signals, errors are located, and modifying selected ones of said derived output signals in that portion thereof identified in accordance with said error pattern template; and wherein said sixth means comprises means for processing said derived output signals in accordance with the signal processing mechanism used by said first means to obtain said first signals; and means for comparing contents of the signals processed by said derived output signals processing means with contents of said received signals and generating therefrom said error pattern template; and wherein said sixth means comprises means for encoding said derived output signals in accordance with the encoding mechanism employed by said second means to obtain re-encoded output signals;

means for encoding said derived output signals in accordance with the encoding mechanism employed by said second means to obtain re-encoded output signals;

means for comparing the accuracy of the re-encoded output signals with the accuracy of the encoded combined signals received and demodulated by said fourth means and producing therefrom second signals representative of differences therebetween;

means for combining respective pluralities of said second signals to obtain respective pluralities of third signals;

means for selectively modifying the contents of a respective plurality of said derived output signals in accordance with the error pattern of said error pattern template, so as to obtain fourth signals representative of a modified version of said derived output signals;

means for encoding said fourth signals in accordance with the encoding mechanism employed by said second means, so as to obtain an encoded modified version of said derived output signals;

means for comparing the accuracy of the encoded fourth signals with the accuracy of the encoded combined signals obtained by said fourth means, and producing therefrom fifth signals representative of differences therebetween;

means for combining a respective plurality of said fifth signals to obtain a respective sixth signal;

means for causing the operation of said fourth signal through sixth signal obtaining means to be repeated for successive pluralities of said derived output signals, thereby obtaining a plurality of said sixth signals;

means for generating seventh signals representative of differences between respective ones of said third and sixth signals;

means for processing seventh signals to obtain eighth signals; and means for locating the beginning of the occurrence of errors, in said derived output signals, at that derived output signal, the corresponding eighth signal for which has a prescribed value relative to the remaining ones of said eighth signals.

7. A system according to claim 6, wherein said first signals comprise overhead bits.

8. A system according to claim 6, wherein said sixth means further includes means for modifying selected ones of said derived output signals in accordance with said error pattern template beginning with the occurrence of located errors and extending over the error pattern template.

9. For use in a communication system in which a stream of digital data is encoded at a transmitter site, transmitted over a communication channel to a receiver site and decoded at said receiver site to recover the digital data, and wherein, at the transmitter site, respective blocks of the original digital data are processed to obtain respective sets of overhead bits associated with said respective blocks and being representative of prescribed characteristics of the digital data, and respective ones of said blocks of digital data are combined with respective ones of said sets of overhead bits to produce a digital bit stream which is then encoded and transmitted over said communication channel to said receiver site whereat the transmitted encoded digital bit stream is received and demodulated to produce a demodulated digital bit stream representative of the encoded digital bit stream and soft decision bits representative of the level of confidence as to how accurately said demodulated digital bit stream represents the encoded digital bit stream, the demodulated digital bit stream and the soft decision bits being subjected to a decoding mechanism to derive output data representative of the blocks of original digital data combined with said sets of overhead bits, an apparatus for detecting and correcting errors in the decoded data comprising:

first means for processing said combined output digital data in accordance with the signal processing mechanism through which the original digital data were processed at the transmitter site to obtain respective blocks of output digital data and associated sets of overhead bits and in accordance with said soft decision bits, and generating therefrom respective error template pattern codes corresponding to the patterns of errors in said respective blocks of output digital data;

second means, coupled with said first means, for processing said respective blocks of output digital data in accordance with said error pattern template codes and said decoding mechanism, so as to identify where, within said blocks of output digital data, errors are located; and third means, coupled to said first and second means, for modifying selected bits of a respective block of output digital data in that portion thereof identified by said second means in accordance with its associated error pattern template code derived by said first means; and wherein said second means comprises:

means for processing said blocks of output digital data in accordance with the signal processing mechanism used at said transmitter site to obtain respective sets of output overhead bits associated therewith; and means for comparing the respective sets of overhead bits contained in the combined output digital data with the respective sets of output overhead bits and generating therefrom said error pattern codes; and wherein said soft decision bits are in the form of first codes representative of the confidence of the digital bit values of the received encoded digital bit stream are generated at said receiver site, and said second means comprises:

means for encoding said blocks of output digital data in accordance with the encoding mechanism employed at said transmitter site to obtain reencoded blocks of digital data and second codes representative of the confidence in the reencoded bit values thereof;

means for generating third codes representative of the Hamming distances between the reencoded blocks of digital data and the blocks of output digital data;

means for generating a first metric representative of a measure of closeness of the re-encoded output data to the received data by summing respective pluralities of said third codes to obtain respective pluralities of fourth codes;

means for selectively modifying the bit values of a respective portion of each respective block of digital output data in accordance with its associated error pattern template code, so as to obtain a modified version of that respective block of output digital data;

means for encoding said modified version of a respective block of output digital data in accordance with the encoding mechanism employed at said transmitter site, so as to obtain an encoded modified version of said respective block of output digital data;

means for generating fifth codes representative of the Hamming distances between the encoded modified version of said respective block of output digital data and its associated original output block of digital data;

means for generating a second metric representative of a measure of the closeness of the encoded modified version of the respective block of output digital data to its associated original output block of digital data by summing respective pluralities of said fifth codes to obtain respective pluralities of sixth codes;

means for causing said fourth code through sixth code obtaining means to repeat their operations for successive portions of a respective block of output digital data, thereby obtaining a plurality of said sixth codes;

means for generating seventh codes representative of the differences between respective ones of said fourth and sixth codes;

means for generating a third metric by processing seventh codes to obtain eighth codes; and means for locating the beginning of the occurrence of errors, in a respective block of said output digital data, at the bit position thereof, the corresponding eighth code for which has a prescribed value relative to the remaining ones of said eighth codes.

10. An apparatus according to claim 9, wherein said third means comprises means for modifying selected blocks of said output digital data in accordance with said error pattern codes beginning with the occurrences of located errors and extending over the spans of the respective error pattern template codes.

11. An apparatus according to claim 9, wherein said overhead bits comprise parity bits.

* * * * *